(12) United States Patent
Langford et al.

(10) Patent No.: US 10,498,342 B2
(45) Date of Patent: Dec. 3, 2019

(54) DISCRETELY ASSEMBLED LOGIC BLOCKS

(71) Applicant: Massachusetts Institute of Technology, Cambridge, MA (US)

(72) Inventors: William Kai Langford, Cambridge, MA (US); Amanda Ghassaei, Cambridge, MA (US); Neil Gershenfeld, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/159,835

(22) Filed: Oct. 15, 2018

(65) Prior Publication Data

US 2019/0190523 A1 Jun. 20, 2019

Related U.S. Application Data

(63) Continuation-in-part of application No. 16/109,947, filed on Aug. 23, 2018.

(60) Provisional application No. 62/549,327, filed on Aug. 23, 2017, provisional application No. 62/591,943, filed on Nov. 29, 2018.

(51) Int. Cl.
    *H03K 19/20* (2006.01)
    *H03K 19/21* (2006.01)
    *H03K 3/037* (2006.01)

(52) U.S. Cl.
    CPC ............. *H03K 19/21* (2013.01); *H03K 19/20* (2013.01); *H03K 3/037* (2013.01)

(58) Field of Classification Search
    CPC ......... H03K 3/037; H03K 19/20; H03K 19/21
    See application file for complete search history.

(56) References Cited

U.S. PATENT DOCUMENTS

| 9,432,298 B1* | 8/2016 | Smith ................. H04L 49/9057 |
| 2014/0145522 A1* | 5/2014 | Gershenfeld ............. F16B 1/00 310/10 |
| 2015/0037914 A1* | 2/2015 | Takahashi ............... H01L 22/14 438/15 |
| 2015/0269979 A1* | 9/2015 | Byeon ...................... G11C 7/10 365/230.03 |
| 2015/0371689 A1* | 12/2015 | Li ....................... G11C 11/4087 711/105 |

\* cited by examiner

*Primary Examiner* — Alexander H Taningco
*Assistant Examiner* — Kurtis R Bahr
(74) *Attorney, Agent, or Firm* — Robert P. Greenspoon; Flachsbart & Greenspoon LLC (57) ABSTRACT

A system and method for producing discretely assembled logic blocks where the logic block assemblies are a 3-dimensional representation of the normal digital design hierarchy. The blocks contain embedded logical functions that are built up from only a few basic 2-dimensional parts that are assembled into a 3-dimensional structure that realizes a particular logic or computing element. These structures can be combined to produce more complex digital structures and even processors. The two basic structural parts are a node and a strut with the strut typically including an embedded logic function. These are combined to produce spatially distributed structures.

20 Claims, 9 Drawing Sheets

DISCRETELY ASSEMBLED LOGIC BLOCKS

This application is a Continuation-in-Part of application Ser. No. 16/109,947 filed Aug. 23, 2018 which claimed priority to U.S. Provisional Patent application No. 62/549,327 filed Aug. 23, 2017 and also claims priority from U.S. Provisional Patent application No. 62/591,943 filed Nov. 29, 2017. Application Ser. Nos. 16/109,947, 62/549,327 and 62/591,943 are hereby incorporated by reference in their entireties.

This invention was made under contract with the United States Army Research Office (ARO) under contract number W911NF-16-1-05681; National Science Foundation (NSF) contract number CMMI-1344222. The government has certain rights in the invention.

BACKGROUND

Field of the Invention

The present invention relates to building blocks of digital logic and more particularly discretely assembled digital computation and logic blocks assembled from a small set of standardized parts.

Description of the Prior Art

Design of an integrated circuit typically utilizes multiple layers of abstraction and hierarchy such that a high-level device description is iteratively broken down into a low-level implementation. For example, large computation devices like processors are made from more elementary blocks such as adders, registers and logic elements. These elements in turn are made from flip-flops and Boolean logic gates which are composed of transistor switches made from doped structures of silicon, polysilicon and/or other semiconductor materials. The high-level design process of a particular block such as an adder or shift register is typically done completely in software using various digital design applications. Standard parts can be stored in parts libraries so as to be accessible to the designer during the design process. Data files from these applications can be simulated and tested for correctness, timing and layout while still in the form of computer data. Finally, the source data files are compiled to produce physical layouts on masks which are subsequently used to etch the actual silicon to produce interconnected transistors, diodes, resistors, inductors and other components of the integrated circuit.

The above-described process is partially automated and is very useful for producing new designs in large integrated circuits. However, there exists a need for a method of using only a few standardized parts that can produce physical structures containing logic blocks that range from single transistors to entire processor cores. These blocks can be spatially arranged and integrated through an automated assembly process. Such parts can be used to fabricate units such as robots.

SUMMARY OF THE INVENTION

The present invention is related to a system of discretely assembled logic blocks and methods for using them. The logic block assemblies are a physical representation of the normal digital design hierarchy. The blocks contain embedded logical functions that are built up from only a few basic 2-dimensional parts that are assembled into a 3-dimensional structure that realizes a particular logic or computing element. These structures can then be combined to produce more complex digital structures and even processors. The two basic structural parts are a node and a strut. These are joined to produce the spatially distributed structures.

DESCRIPTION OF THE FIGURES

Several figures are now presented to illustrate features of the present invention.

Several drawings and illustrations have been presented to aid in understanding the present invention. The scope of the present invention is not limited to what is shown in the figures.

DESCRIPTION OF PREFERRED EMBODIMENTS

Figure 1:
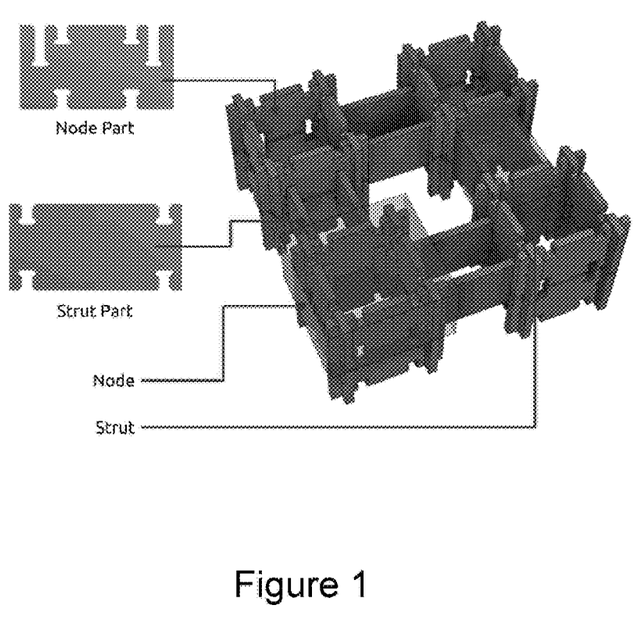
FIG. 1 shows an embodiment of the basic 3-dimensional structure using two basic 2-dimensional parts—a node and a strut.

The present invention constructs 3-dimensional structures that perform basic digital logic functions from two types of 2-dimensional parts—a node part, and a strut part. FIG. 1 shows an embodiment of such a structure and illustrates the two elementary parts types. It can be seen from FIG. 1, that the two elementary parts key together to form the 3-dimensional rectangular lattice structure. While such a structure can function solely as a structure, the present invention uses this type of structure to realize digital components. This is done by attaching small surface mount IC packages in the center of the strut parts. These IC packages contain standard silicon digital gates and other components.

Figure 2:
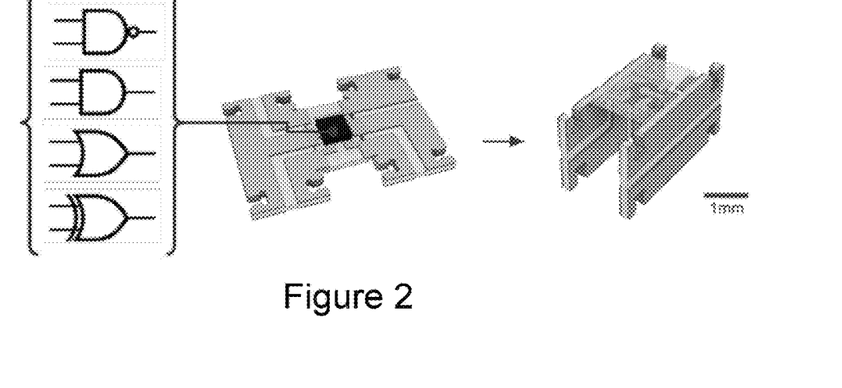
FIG. 2 shows a design of a logic block that embeds the smallest commercially packaged logic integrated circuits (ICs) the SOT1226 package onto a strut which can be assembled in our lattice architecture.

Parts with a single logic element serve as the basis for the assembly of structures that compute. FIG. 2 shows a design of a logic block that embeds a small commercially packaged logic integrated circuit (IC), the SOT1226 package (available from NXP Semiconductors) onto a strut which can be assembled in the lattice architecture. In the embodiment of FIG. 2, the package contains four logic gates: an AND gate, a NAND gate, an OR gate and an exclusive or XOR gate.

With these particular logic-level building blocks, computational components like a half-adder can be assembled. It can be seen in FIG. 2 that an exemplary way to configure a logic block may combine and attach two struts, so that an IC package rests between the respective long sides. As finally constructed, the two struts may be at right angles to the IC package that exists between them. A resulting structure can be assembled that is only a few millimeters square. However, the technology of the present invention is not size-dependent and can be adapted to different size scales as needed. While the embodiment of FIG. 2 is a few millimeters, many similar structures of different sizes can be realized including structures much smaller than 1 mm.

Interconnections between strut components with embedded logic can be realized with both node components and other strut components. Three node part-types (conductive, insulating, and split-conductive), as well as four strut part-types (conductive, insulating, split-conductive, and crossover) are sufficient for routing most logic.

Figure 3A:
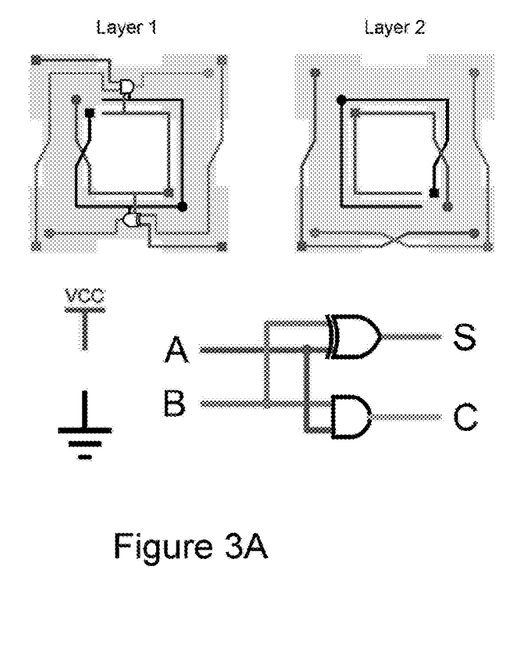
FIG. 3A shows a half-adder constructed using two gates from the strut shown in FIG. 2.
Figure 3B:
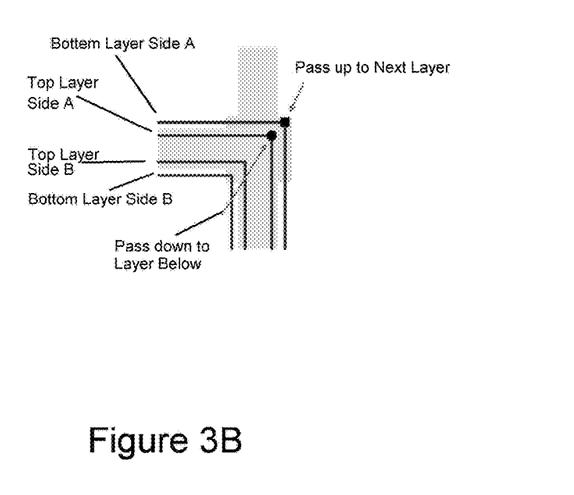
FIG. 3B shows how various layers on the strut are wired.

FIG. 3A shows a half-adder made from two of the gates in the strut. In this case, an XOR block and an AND block are wired to produce a SUM and a CARRY output from A and B inputs. In this embodiment, two layers have been used, a top layer and a bottom layer. Each layer has two sides. FIG. 3B shows how the layers communicate with one-another. In this embodiment, they pass signals at connections near the corners. Squares in FIG. 3B indicate a connection that passes signals up to the layer above. Circles indicate a connection that passes signals down to the layer below.

Figure 4:
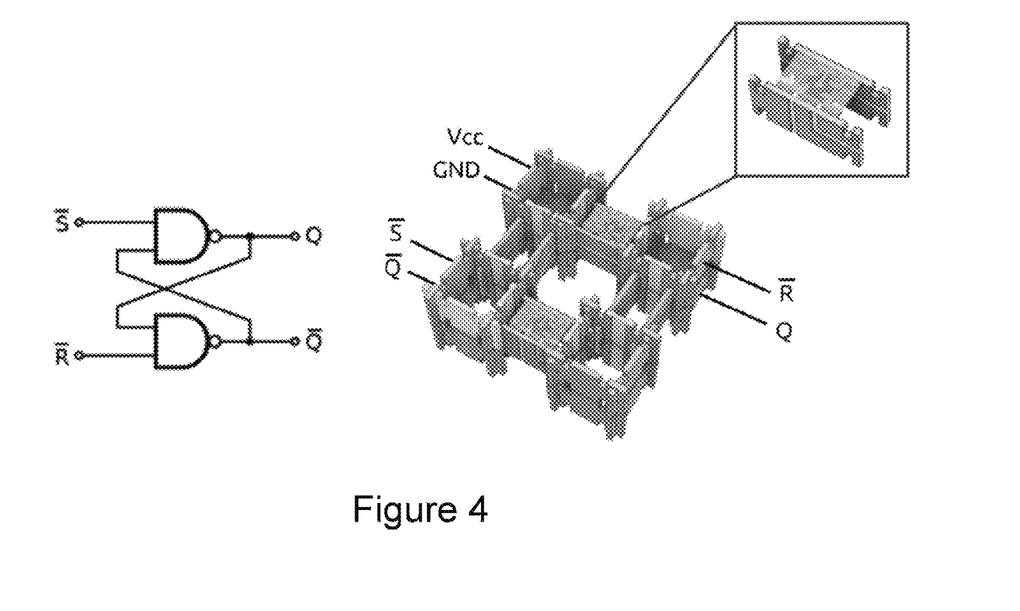
FIG. 4 shows construction of an S-R flip-flop.

A set-reset (SR) flip-flop can be made from two cross-coupled NAND gates as shown in FIG. 4. The SR flip-flop can thus be assembled with two NAND logic block struts and a few additional parts to route the required traces. An embodiment of a strut-node assembly for the SR-Flip can be seen in FIG. 4. The gate-containing struts are supported with nodes and then assembled into a larger square structure with additional connecting struts and nodes that do not, themselves, contain logic. The inputs and outputs on this larger structure can be seen. Inputs and outputs as well as power appears on the outer sides of the structure.

Figure 5:
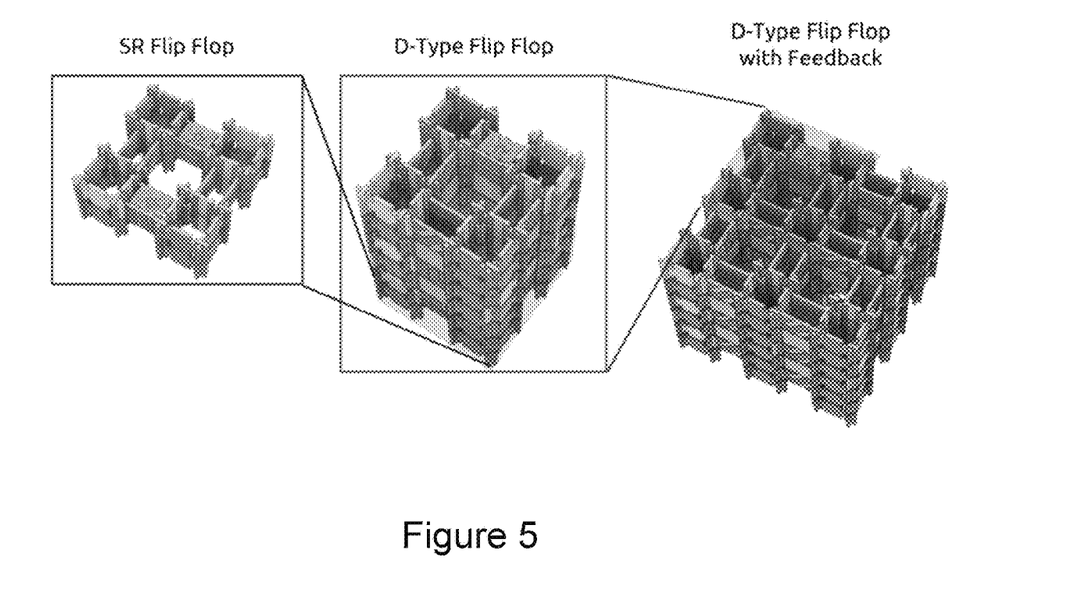
FIG. 5 shows using the S-R flip-flop to create a D-flip-flop and finally a D-flip-flop with feedback that becomes a divider.

A D-type flip flop can be crated from an SR flip-flop with two additional NAND gates such that the logic state can be latched and unlatched with a clock pulse. This is shown in FIG. 5. The D-type flip-flop can be assembled with three additional layers to house two extra NAND gates and an inverter. Furthermore, routing can be added to connect Q-NOT to the D-input to configure this flip-flop to serve as a frequency divider with feedback. It can be seen from FIG. 5 that the structure is expanded in the third dimension to make the D-type flip-flop. This is then placed in a still larger structure to make the divider.

Figure 6:
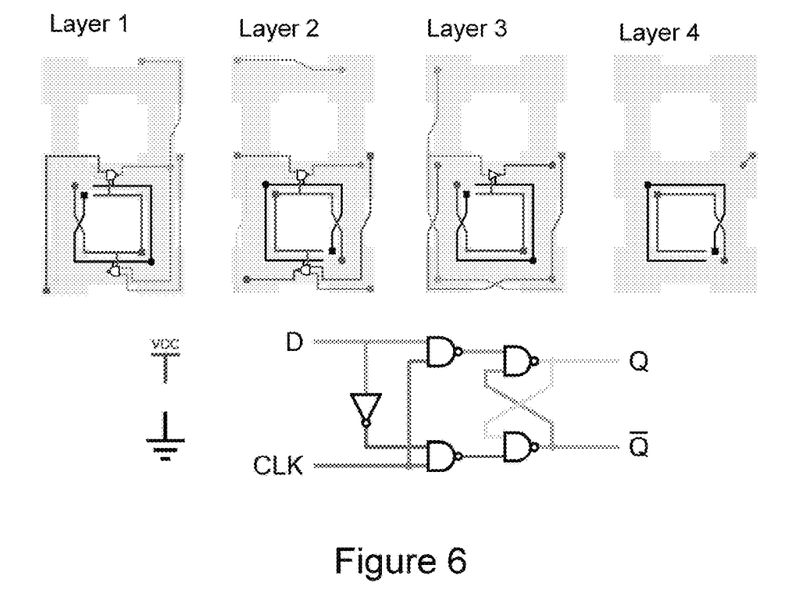
FIG. 6 shows the a strut layer layout and a logic diagram that produces the circuit of FIG. 5 from the assembly architecture

FIG. 6 shows a routing diagram to reproduce the desired circuit of FIG. 5 out of the assembly architecture. Power and ground are routed on inner loops of the structure so that they are accessible to all components in the system, and so that the signal wires are accessible from the perimeter. Most of the routing is accomplished in a 2×2×3 grid of the lattice with the exception of the feedback loop connecting Q-NOT to D that is required for the frequency divider. In this embodiment, four layers are used.

Figure 7:
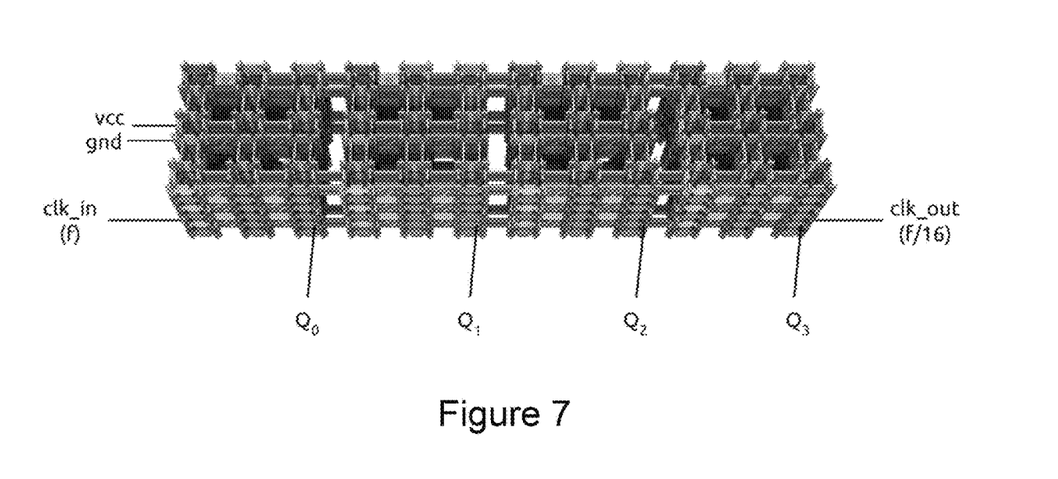
FIG. 7 shows a divide-by-16 circuit. The output is $1/16$ the frequency of the input clock.

With the D-type flip-flop structures as building blocks, higher level assemblies like a ripple counter or frequency divider can be assembled. The structure shown in FIG. 7 receives a clock pulse and counts in binary on the Q outputs to provide an output square wave at one-sixteenth the input frequency. It can be seen that the total structure is made from four connected D-type flip-flop dividers.

In addition to frequency dividers, D-type flip-flops may be connected together or connected to simple Boolean logic to form other digital elements such as shift registers or counters, and they may be combined with elements like half or full adders to form arithmetic units.

Prototyping

Figure 8A:
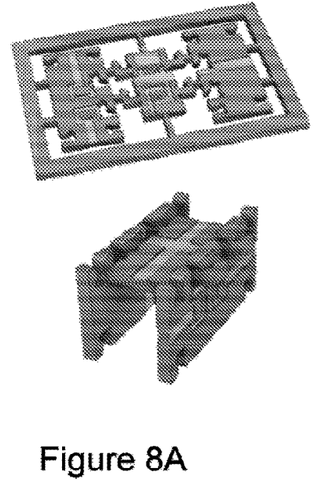
FIGS. 8A-8B show fabricated parts that contain a flip-flop and the required routing to interface with the assembly architecture.
Figure 8B:
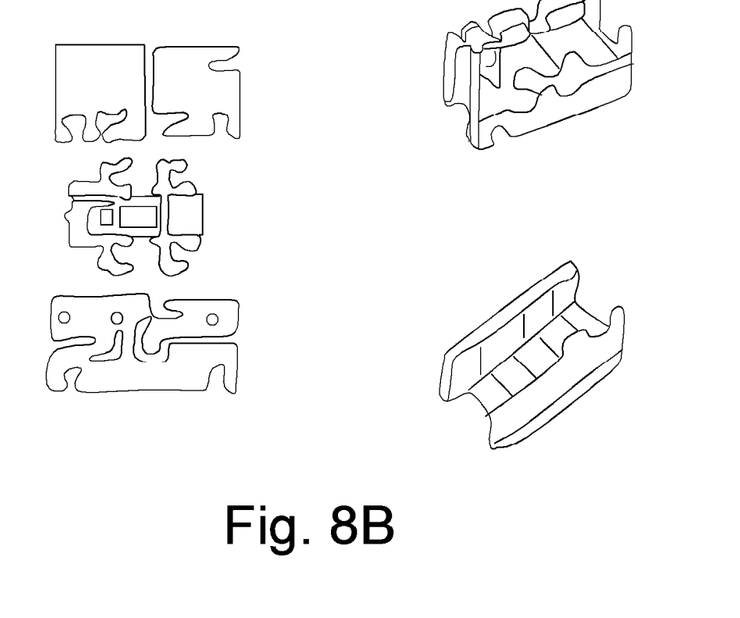

Physical parts have been fabricated with the goal of assembling logical structures and circuits that can be used to control a robot or other device. The parts shown in FIGS. 8A-8B contain a flip-flop IC and the required routing to interface with the assembly architecture. As a strut in this architecture, the part connects two nodes together, providing inputs for D, CLK, GND, and VCC and outputs for Q, GND, and VCC.

Figure 9A:
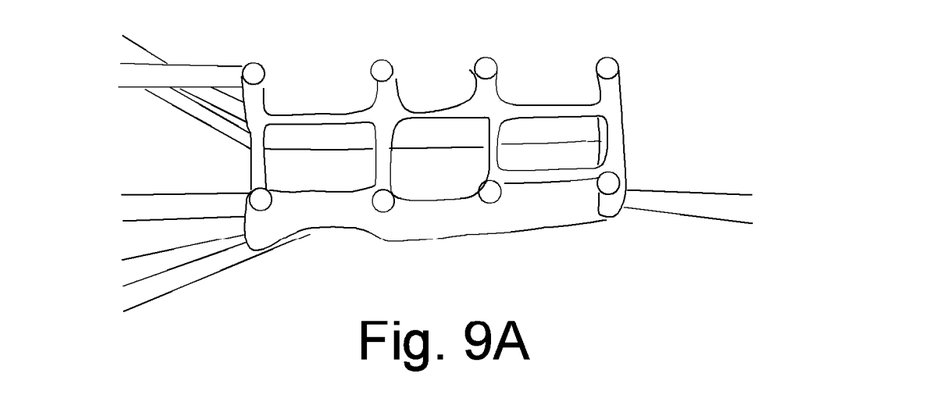
FIG. 9A shows a fabricated D-type flip-flop.
Figure 9B:
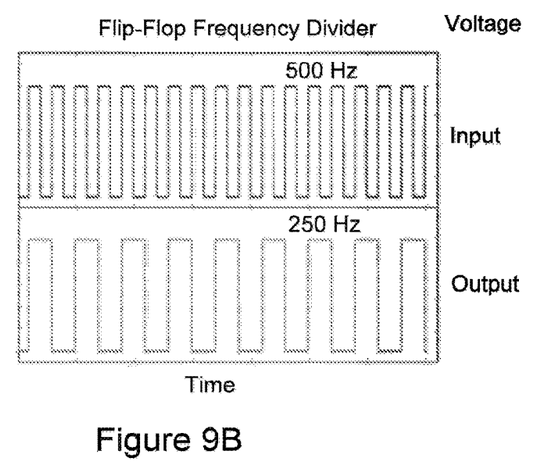
FIG. 9B shows a graph of the circuit of FIG. 9A dividing the frequency by two.

FIG. 9A shows a fabricated D-type flip-flop. FIG. 9B shows a graph of the measured and validated performance of a single flip-flop part acting as a frequency divider. An input square wave at 500 Hz is divided into an output square wave with 250 Hz.

Using functional parts such as flip-flops, one can assemble frequency dividing circuits which can be used to time and control actuation signals in a structure like a walking motor.

Figure 10:
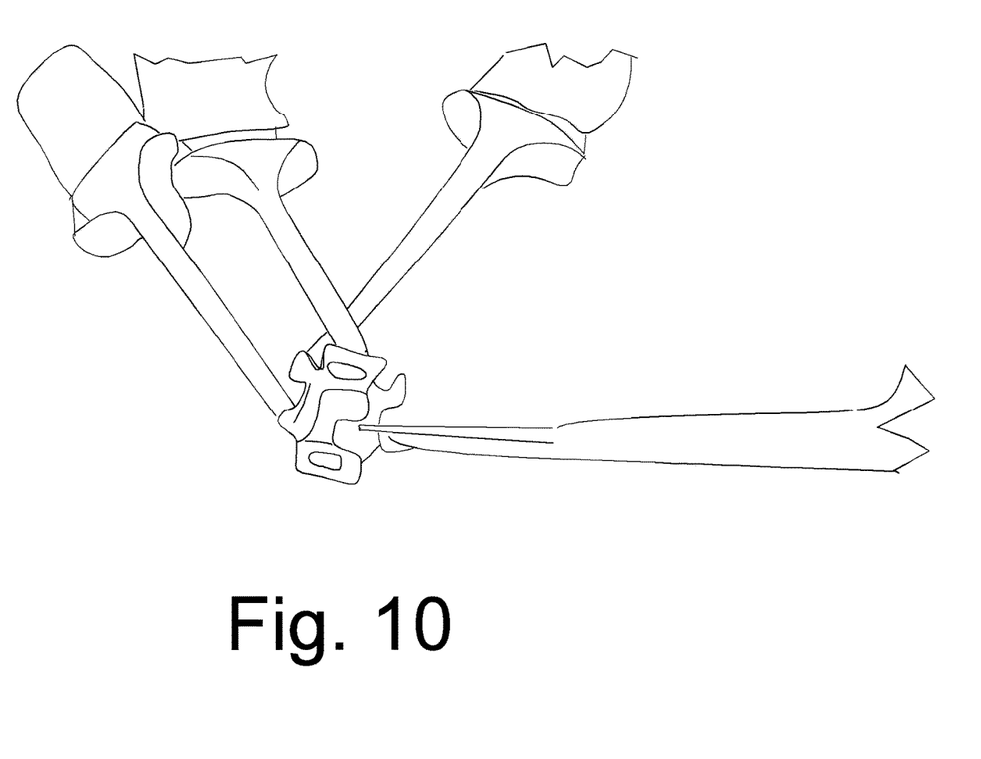
FIG. 10 shows testing of a strut with a ATtiny processor.

In addition to assembling logic devices from single transistor parts or flip-flop parts, more complex devices can be assembled by using parts with more functionality. With a small processor, such as the prior art ATtiny10 (available from Microchip Technology), and an h-bridge, like the DRV8838 (available from Texas Instruments), one can assemble the controls for an actuated degree-of-freedom device. These two parts enable driving current through actuator coils bidirectionally in a controlled manner. In a particular embodiment, the ATtiny processor is programmed to output a triangle wave toggling a direction pin every period. FIG. 10 shows testing of a strut with a ATtiny processor.

Figure 11:
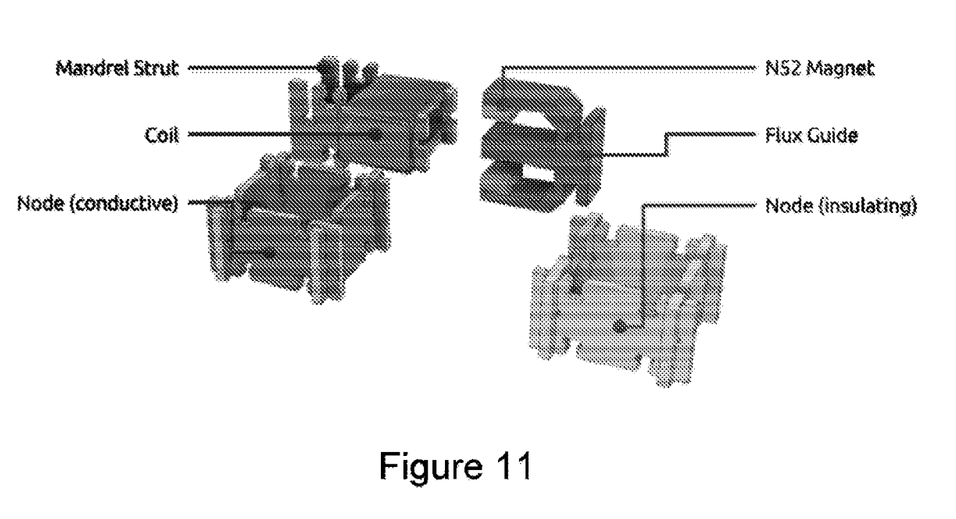
FIG. 11 shows an actuation mechanism made with just a few part-types.

Actuation mechanisms can be made in this assembly system with just a few part-types including single degree-of-freedom hinge parts, two degree-of-freedom hinge parts, rigid parts, as well as magnetic and coil-type parts. The basic actuator arrangement is shown in FIG. 11. Here an N52 magnet with coil is mounted in a mandrel strut, and insulating node and a conductive node to produce a coil part.

Figure 12:
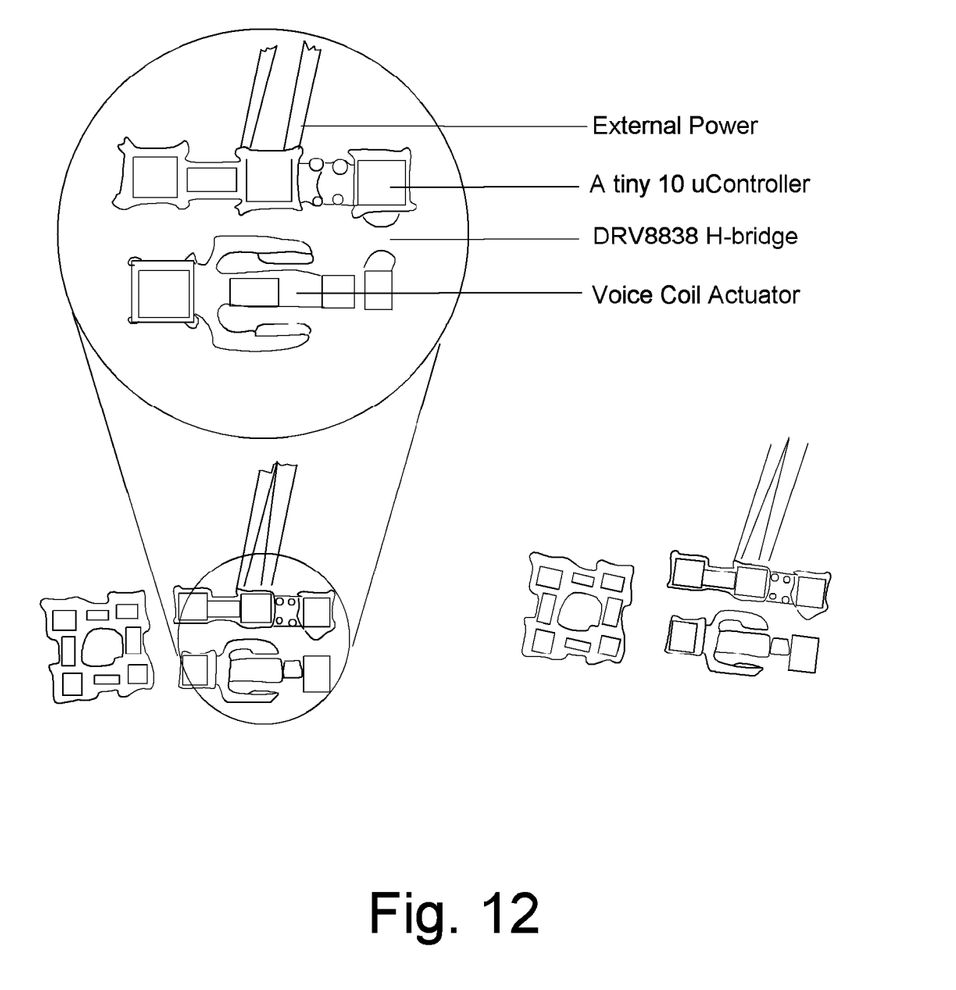
FIG. 12 shows an actuated mechanism with all of the control logic on-board.

Ultimately the microprocessor and h-bridge parts can be assembled and integrated with the actuator, mechanism, and structure. The device in FIG. 12 shows an actuated mechanism with all of the control logic on-board. Only power needs to be provided externally. The three figures show how the actuator can change the angles between parts of the structure.

Beyond tiny microprocessors for actuation control, the assembly approach of the present invention can be applied to building blocks with even more embedded functionality including processor cores, memories, and communication interfaces to enable configuration of three dimensional application specific high performance computing structures.

In summary, the present invention provides a method and system for assembling physical arrays that provide digital operations by combining digital logic from simple gates and flip-flops to more complex structures into 3-dimensional assembled structures that find use in the construction of robots and other devices. While many types of circuits can be made from struts with only embedded gates, much more complex and compact structures can be made by also including struts with small processors, h-bridges and other functional IC components attached.

Several descriptions and illustrations have been provided to aid in understanding the present invention. One with skill in the art will understand that numerous changes and variations may be made without departing from the spirit of the invention. Each of these changes and variations is within the scope of the present invention.

We claim:

1. A system for assembling 3-dimensional digital logic structures from 2-dimensional parts comprising:
   2-dimensional strut parts, wherein one or more of the strut parts contains at least one embedded digital logic function, the one or more strut parts having electrical connections allowing electrical access to the embedded digital logic function;
   2-dimensional node parts configured to connect strut parts together to form a 3-dimensional structure that can perform a final digital logic function.

2. The system of claim 1 wherein there are three types of node parts: conductive node parts, insulated node parts and split-conductive.

3. The system of claim 1 wherein there are four types of strut parts: conductive strut parts, insulated strut parts, split-conductive strut parts and cross-over strut parts.

4. The system of claim 1 wherein at least some of strut parts include a plurality of logic gates.

5. The system of claim 4 wherein a plurality of strut parts containing logic gates are connected together with node parts to form an adder.

6. The system of claim 1 wherein at least some of the strut parts include a processor.

7. The system of claim 1 wherein at least some of the strut parts include and h-bridge.

8. The system of claim 1 where a plurality of strut parts are connected together with node parts to form a D-type flip-flop.

9. The system of claim 8 wherein several D-type flip-flops are connected together to form a frequency divider.

10. The system of claim 8 wherein several D-type flip-flops are connected together to form a shift register.

11. The system of claim 1 wherein the embedded digital logic function is a digital integrated circuit (IC) attached to a strut part.

12. The system of claim 11 wherein the digital integrated circuit (IC) is in a SOT1226 surface mount package.

13. A system for creating a 3-dimensional physical structure that performs digital logic operations comprising a plurality of interlocking strut parts and node parts, wherein at least one of the strut parts contains an embedded digital integrated circuit (IC).

14. The system of claim 13, wherein there are three types of node parts: conductive node parts, insulated node parts and split-conductive.

15. The system of claim 13, wherein there are four types of strut parts: conductive strut parts, insulated strut parts, split-conductive strut parts and cross-over strut parts.

16. The system of claim 13 wherein the digital integrated circuit (IC) contains at least four different logic gates.

17. The system of claim 16 wherein the four different logic gates are AND, NAND, OR and XOR.

18. A method of constructing 3-dimensional logic structures comprising:
   providing a plurality of node parts;
   providing a plurality of strut parts, wherein at least one of the strut parts contains an embedded logic function;
   interlocking node parts and strut parts to form a 3-dimensional structure that performs the embedded logic function.

19. The method of claim 18, wherein there are three types of node parts: conductive node parts, insulated node parts and split-conductive.

20. The system of claim 18, wherein there are four types of strut parts: conductive strut parts, insulated strut parts, split-conductive strut parts and cross-over strut parts.

* * * * *